(12) United States Patent
Patel et al.

(10) Patent No.: US 10,586,581 B1
(45) Date of Patent: Mar. 10, 2020

(54) DYNAMIC BIPOLAR WRITE-ASSIST FOR NON-VOLATILE MEMORY ELEMENTS

(71) Applicant: GLOBALFOUNDRIES Inc., Grand Cayman (KY)

(72) Inventors: Harsh N. Patel, Clifton Park, NY (US); Bipul C. Paul, Mechanicville, NY (US); Joseph Versaggi, Galway, NY (US)

(73) Assignee: GLOBALFOUNDRIES INC., Grand Cayman (KY)

( * ) Notice: Subject to any disclaimer, the term of this patent is extended or adjusted under 35 U.S.C. 154(b) by 0 days.

(21) Appl. No.: 16/205,921

(22) Filed: Nov. 30, 2018

(51) Int. Cl.
| | |
|---|---|
| *G11C 11/16* | (2006.01) |
| *G11C 13/00* | (2006.01) |
| *G11C 5/14* | (2006.01) |
| *H01L 45/00* | (2006.01) |
| *H01L 43/02* | (2006.01) |
| *H01L 43/12* | (2006.01) |

(52) U.S. Cl.
CPC .......... *G11C 11/1675* (2013.01); *G11C 5/145* (2013.01); *G11C 11/161* (2013.01); *G11C 11/1655* (2013.01); *G11C 11/1697* (2013.01); *G11C 13/0026* (2013.01); *G11C 13/0038* (2013.01); *G11C 13/0069* (2013.01); *H01L 43/02* (2013.01); *H01L 43/12* (2013.01); *H01L 45/12* (2013.01); *H01L 45/16* (2013.01)

(58) Field of Classification Search
CPC .... G11C 11/1675; G11C 5/145; G11C 11/161
USPC ....................... 365/158, 171, 173
See application file for complete search history.

(56) References Cited

U.S. PATENT DOCUMENTS

| | | |
|---|---|---|
| 7,272,034 B1 * | 9/2007 | Chen ................ G11C 11/16 365/158 |
| 9,396,782 B2 | 7/2016 | Alvarez-Hrault et al. |
| 9,542,989 B2 | 1/2017 | Gogl et al. |
| 9,577,009 B1 | 2/2017 | Shih et al. |
| 9,842,638 B1 | 9/2017 | Li et al. |
| 9,786,343 B1 | 10/2017 | DeBrosse |

(Continued)

OTHER PUBLICATIONS

Yang et al., "A 28nm 32Kb embedded 2T2MTJ STT-MRAM macro with 1.3ns read-access time for fast and reliable read applications," 2018 IEEE International Solid—State Circuits Conference—(ISSCC), San Francisco, CA, 2018, pp. 182-484.

(Continued)

*Primary Examiner* — Han Yang
(74) *Attorney, Agent, or Firm* — Thompson Hine LLP

(57) ABSTRACT

Structures for a non-volatile memory and methods for forming and using such structures. A bitcell of the non-volatile memory includes a nonvolatile memory element and a field-effect transistor having a drain region coupled with the nonvolatile memory element, a source region, and a gate electrode. A word line is coupled with the gate electrode of the field-effect transistor, a bit line is coupled with the nonvolatile memory element, and a source line is coupled with the source region of the field-effect transistor. A power supply is configured to supply a negative bias voltage to the bit line in order to provide a first state for writing data to the nonvolatile memory element or to supply the negative bias voltage to the source line in order to provide a second state for writing data to the nonvolatile memory element.

20 Claims, 2 Drawing Sheets

(56) References Cited

U.S. PATENT DOCUMENTS

| 9,934,853 B2 | 4/2018 | Yang et al. |
| 2014/0063922 A1 | 3/2014 | Kim et al. |
| 2019/0006415 A1* | 1/2019 | Li ........................ G11C 11/1655 |

OTHER PUBLICATIONS

Gilbert et al., "A 0.6V 8 pJ/write Non-Volatile CBRAM Macro Embedded in a Body Sensor Node for Ultra Low Energy Applications" Conference paper from the 2013 Symposium on VLSI Tech., Dig. C204-C205.

* cited by examiner

DYNAMIC BIPOLAR WRITE-ASSIST FOR NON-VOLATILE MEMORY ELEMENTS

BACKGROUND

The present invention relates to integrated circuits and semiconductor device fabrication and, more specifically, to structures for a non-volatile memory and methods for forming and using such structures.

Magnetic random access memory (MRAM) provides an embedded non-volatile memory technology based on principles of magnetoresistance. Because the memory elements of the MRAM are non-volatile, the stored data is retained when the memory elements are not powered.

In an MRAM bitcell, data is stored by a magnetoresistive memory element made from a pinned magnetic layer and a free magnetic layer, each of which holds a magnetization. The magnetization of the pinned layer is fixed in its magnetic orientation, and the magnetization of the free layer can be changed by an external magnetic field generated by a programming current. In particular, the external magnetic field can cause the magnetic orientations of the magnetic layers to either be parallel, giving a lower electrical resistance across the layers ("0" state), or antiparallel, giving a higher electrical resistance across the layers ("1" state). The switching of the magnetic orientation of the free layer and the resulting high or low resistance states across the magnetic layers provide for the write and read operations of the MRAM bitcell.

A non-volatile memory includes multiple active MRAM bitcells that are arranged in an array of rows and columns. Each active bitcell in the array includes a field-effect transistor that controls access to the memory element for reading and writing data. A word line is connected to the gates of the field-effect transistors in each row of the array. The word line may be used to select the field-effect transistors in a row of active bitcells for data read and write operations to the related memory elements.

Conventional MRAM bitcells require multiple power rails in order to control read and write operations. For example, a positive gate voltage is required during write operations to switch the magnetic orientation of the free layer from parallel alignment to antiparallel alignment with the magnetic orientation of the fixed layer, and a different positive gate voltage is required during write operations to switch the magnetic orientation of the free layer from antiparallel alignment to parallel alignment with the magnetic orientation of the fixed layer. In addition, a positive voltage is supplied to either the bit line or the source line depending on the specific write operation. One approach for providing the needed power rails is to provide multiple regulated supply rails. However, this approach results in power efficiency loss in voltage regulators and increased design complexity. Another approach for providing the needed power rails is to provide internally-generated supply rails. However, this approach incurs a large area penalty. In addition to these deficiencies, the gates of the field-effect transistors must be overdriven during write operations, which may cause reliability issues.

Improved structures for a non-volatile memory and methods for forming and using such structures are needed.

SUMMARY

According to an embodiment of the invention, a memory structure includes a bitcell having a nonvolatile memory element, as well as a field-effect transistor having a drain region coupled with the nonvolatile memory element, a source region, and a gate electrode. The memory structure further includes a word line coupled with the gate electrode of the field-effect transistor, a bit line coupled with the nonvolatile memory element, and a source line coupled with the source region of the field-effect transistor. A power supply is configured to supply a negative bias voltage to the bit line in order to provide a first state for writing data to the nonvolatile memory element or to supply the negative bias voltage to the source line in order to provide a second state for writing data to the nonvolatile memory element.

According to another embodiment of the invention, a method includes forming a bitcell including a nonvolatile memory element and a field-effect transistor having a drain region coupled with the nonvolatile memory element, a source region, and a gate electrode, forming a word line coupled with the gate electrode of the field-effect transistor, forming a bit line coupled with the nonvolatile memory element, and forming a source line coupled with the source region of the field-effect transistor. The method further includes forming a power supply configured to supply a negative bias voltage to the bit line in order to provide a first state for writing data to the nonvolatile memory element or to supply the negative bias voltage to the source line in order to provide a second state for writing data to the nonvolatile memory element.

According to another embodiment of the invention, a method includes providing a bitcell including a nonvolatile memory element and a field-effect transistor having a drain region coupled with the nonvolatile memory element, a source region, and a gate electrode. The method further includes supplying a negative bias voltage to a bit line coupled with the nonvolatile memory element to provide a first state for writing data to the nonvolatile memory element. The method further includes supplying the negative bias voltage to a source line coupled with the source region of the field-effect transistor to provide a second state for writing data to the nonvolatile memory element.

BRIEF DESCRIPTION OF THE DRAWINGS

The accompanying drawings, which are incorporated in and constitute a part of this specification, illustrate various embodiments of the invention and, together with a general description of the invention given above and the detailed description of the embodiments given below, serve to explain the embodiments of the invention. In the drawings, like reference numerals refer to like features in the various views.

DETAILED DESCRIPTION

Figure 1:
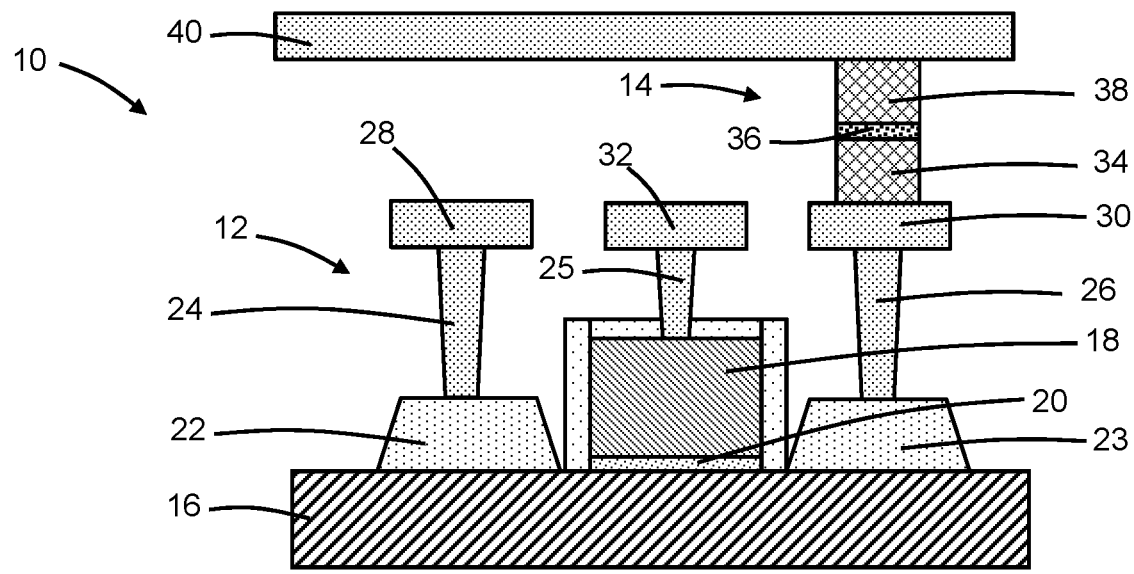
FIG. 1 is a cross-sectional view of a bitcell in accordance with embodiments of the invention.

With reference to FIG. 1 and in accordance with embodiments of the invention, a bitcell 10 for a magnetic random access memory (MRAM) includes a field-effect transistor 12 and a magnetic tunneling junction (MTJ) memory element 14 as a representative nonvolatile memory element that is coupled with the field-effect transistor 12. The field-effect transistor 12 may be formed by front-end-of-line (FEOL)

processing using a substrate 16 that may be composed of a single-crystal semiconductor material, such as single-crystal silicon. In an embodiment, the field-effect transistor 12 may include a gate structure having a gate electrode 18 and a gate dielectric 20. The gate electrode 18 may be composed of a conductor, such as doped polycrystalline silicon (i.e., polysilicon), and the gate dielectric 20 may be composed of an electrical insulator, such as silicon dioxide. Alternatively, the gate electrode 18 may include one or more conformal barrier metal layers and/or work function metal layers, such as metal layers composed of titanium aluminum carbide and/or titanium nitride, and a metal gate fill layer composed of a conductor, such as tungsten, and the gate dielectric 20 may be composed of a high-k dielectric material, such as hafnium oxide. The field-effect transistor 12 may include a source region 22 and a drain region 23 composed of a doped semiconductor material (e.g., silicon or silicon-germanium) that may be grown by an epitaxial growth process. In an embodiment, the source region 22 and drain region 23 may contain an n-type dopant (e.g., arsenic and/or phosphorus) providing n-type conductivity.

The field-effect transistor 12 may be a planar field-effect transistor. In an alternative embodiment, the field-effect transistor 12 may be a fin-type field-effect transistor formed using one or more semiconductor fins, and the gate structure may overlap with and wrap about the sides of the one or more semiconductor fins with the gate dielectric 20 arranged between the gate electrode 18 and the sides of the fins. In an alternative embodiment, the field-effect transistor 12 may be a gate-all-around field-effect transistor in which semiconductor channel layers are arranged in a layer stack and the gate electrode is wrapped about all sides of each semiconductor channel layer.

An interconnect structure may be formed by a middle-of-line (MOL) process and/or back-end-of-line (BEOL) process over the field-effect transistor 12 following the completion of FEOL processing. Conductive features in one or more metallization levels of the interconnect structure are connected with the field-effect transistor 12 and the MTJ memory element 14, and the MTJ memory element 14 is formed in one or more of the metallization levels.

The interconnect structure includes a source line 28 coupled by a contact 24 with the source region 22 of the field-effect transistor 12, a pad 30 coupled by a contact 26 with the drain region 23 of the field-effect transistor 12, a word line 32 coupled by a contact 25 with the gate electrode 18 of the field-effect transistor 12, and a bit line 40 coupled with the MTJ memory element 14. The contacts 24, 25, 26, source line 28, pad 30, word line 32, and bit line 40 are embedded in one or more dielectric layers (not shown) as conductive features. The one or more dielectric layers may be comprised of an electrically-insulating dielectric material, such as an oxide of silicon (e.g., silicon dioxide) deposited by chemical vapor deposition. The contacts 24, 25, 26 may be comprised of a conductor, such as a metal like tungsten or cobalt, and may be clad by a conductive barrier/liner (not shown). The source line 28, pad 30, word line 32, and bit line 40 may be comprised of a conductor, such as copper or cobalt, formed by a damascene process.

The MTJ memory element 14 is located on the pad 30 of the interconnect structure. The MTJ memory element 14 includes a magnetically pinned or fixed layer 34, a tunnel barrier layer 36, and a magnetically free layer 38. The magnetization or magnetic orientation of the fixed layer 34 is pinned or fixed to a particular direction while the magnetization or magnetic orientation of the magnetically free layer 38 may be switched based on an applied current density and direction of a programming current supplied by applied bias voltages. In particular, the magnetization of the magnetically free layer 38 may be switched by a programming current to be aligned in a direction parallel to the magnetization of the magnetically fixed layer 34, or switched by a programming current to be aligned in a direction antiparallel to the magnetization the magnetically fixed layer 34, depending on a direction of the programming current supplied to the MTJ memory element 14. Because of increased tunneling across the tunnel barrier layer 36 in the parallel state, the electrical resistance across the tunnel barrier layer 36 between the magnetically free layer 38 and the magnetically fixed layer 34 in the parallel state is less than the electrical resistance across the tunnel barrier layer 36 between the magnetically free layer 38 and the magnetically fixed layer 34 in the antiparallel state. The comparatively low and high electrical resistance states of the MTJ memory element 14 define two distinct memory states capable of storing binary data.

The magnetically fixed layer 34 may be a layer stack that includes one or more magnetic layers composed of, for example, a cobalt-iron-boron alloy or a cobalt-iron alloy deposited by physical vapor deposition. The magnetization of the magnetically fixed layer 34 is pinned such that the magnetization cannot flip (i.e., rotate) in the presence of an applied magnetic field and thereby acts as a fixed reference. The tunnel barrier layer 36 may be composed of a non-magnetic and electrically insulating layer, such as magnesium oxide or aluminum oxide. The magnetically free layer 38 may also be composed of an alloy magnetic layer or a multilayer that includes one or more layers of, for example, a cobalt-iron-boron alloy or a cobalt-iron) alloy, or a nickel-iron alloy. The MTJ memory element 14 may also include top and/or bottom electrodes (not shown) comprised of a conductive material, such as tantalum or tantalum nitride.

The MTJ memory element 14 uses principles of spin transfer torque to effectuate a change in the direction of magnetization of the free layer 38 that provides the two different memory states. To that end, the field-effect transistor 12 causes a spin polarized current to flow vertically through the MTJ memory element 14. When electrons flow across the MTJ memory element 14 in a direction from the fixed layer 34 to the free layer 38, spin torque from these electrons orientates the magnetization of the free layer 38 in a direction that is parallel to the magnetization of the fixed layer 34. When electrons flow across the MTJ memory element 14 in a direction from the free layer 38 to the fixed layer 34, spin torque from electrons that are reflected from the fixed layer 34 back into the free layer 38 orientates the magnetization of the free layer 38 to be anti-parallel relative to the magnetization of the fixed layer 34. Thus, controlling the direction of the electron (current) flow causes switching of the direction of magnetization of the free layer 38 relative to the fixed layer 34, and the associated resistance changes between low and high states based on the magnetization of the free layer 38, i.e. parallel versus anti-parallel, relative to that of the fixed layer 34. The switch in the magnetization direction of the free layer 38 may be used to write data to the bitcell 10 that includes the MTJ memory element 14.

The field-effect transistor 12 and MTJ memory element 14 of the bitcell 10 may be arranged in rows and columns with other similar bitcells 10 to define a non-volatile memory array. The source line 28 and bit line 40 associated with each column in the non-volatile memory provide a bidirectional current path for reading and writing data values to one or more bitcells 10 of the column. The word line 32 is coupled to a particular row of bitcells 10 to enable the bitcells 10 in that row to be selected for data read and write operations.

In an embodiment, the bitcell 10 may include a resistive memory element, instead of the MTJ memory element 14, as a nonvolatile memory element, and be included in a resistive random access memory (ReRAM) array. Data is stored in the resistive memory element by changing the resistance across a layer containing a dielectric material to provide different states. The dielectric material, which is normally insulating, can be made to conduct through one or more filaments or conductive paths generated by applying a sufficiently high voltage. The memory element of the bitcell switches between the insulating and conducting phases by creating or destroying the filament(s) to provide a "0" state or a "1" state.

Figure 2:
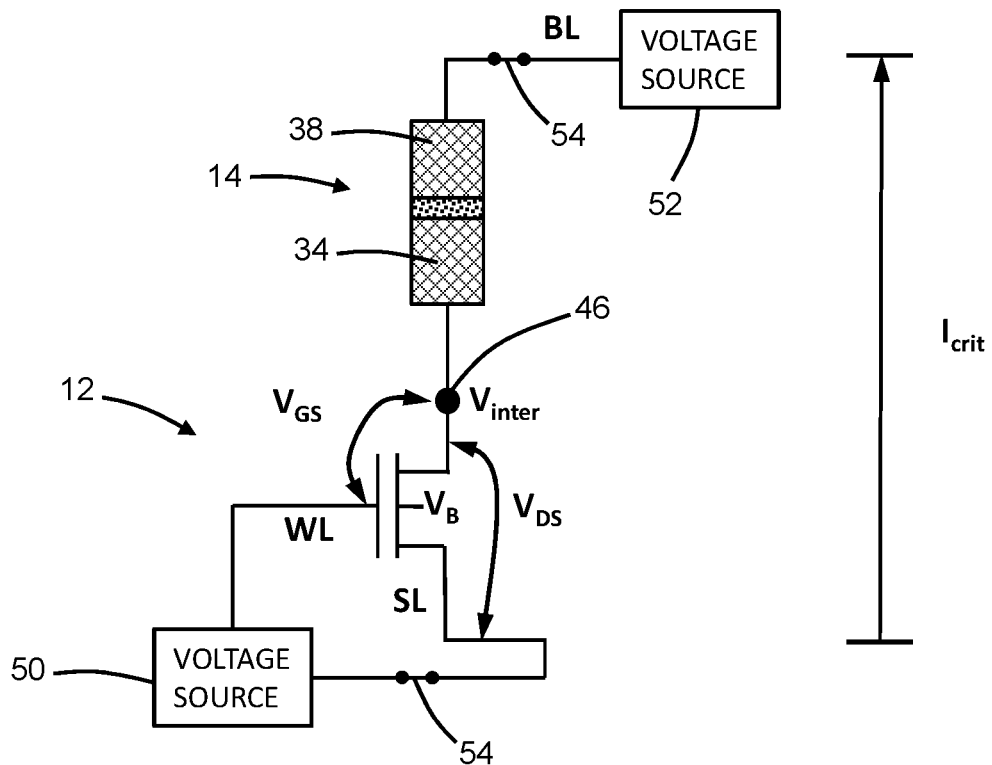
FIG. 2 is a circuit diagram of the bitcell under biasing to produce a transition from a parallel state to an antiparallel state.

With reference to FIGS. 1 and 2, a biasing scheme is described for a write operation with parallel-to-antiparallel switching that causes the magnetically free layer 38 in the bitcell 10 to change or switch from a parallel state relative to the fixed layer 34 to an antiparallel state relative to the fixed layer 34. The magnetization of the fixed layer 34 and the magnetization of the free layer 38 are in a parallel state before the write operation, and the magnetization of the fixed layer 34 and the magnetization of the free layer 38 are in an anti-parallel state following the write operation.

The source line 28 and the word line 32 are connected with a common voltage source 50 serving as a power supply, and may be powered with equal positive bias voltages supplied from the voltage source 50. In an embodiment, the positive bias voltage may be supplied from the positive (VDD) power rail, which is a regulated voltage source, and the source line 28 may be connected with the voltage source 50 by closing a switch 54. The bit line 40 may be coupled with a voltage source 52 serving as a power supply by closing a switch 54, and may be powered with a negative bias voltage supplied from the voltage source 52. In an embodiment, the voltage source 52 may be an internally-generated uncontrolled biasing voltage supply, such as a charge pump, and not a controlled or regulated voltage source as in conventional biasing schemes.

The negative bias voltage supplied by the bit line 40 appears at a node 46 between the field-effect transistor 12 and MTJ memory element 14 as an internal voltage ($V_{inter}$) that is equal to the drain voltage of the field-effect transistor 12. The gate-to-source voltage ($V_{GS}$) and the drain-to-source voltage ($V_{DS}$) of the field-effect transistor 12 are effectively increased by the negative bias voltage at the node 46, which enables the reduction in the word line voltage, and at the same time increases the current supplied to the MTJ memory element 14.

In an embodiment, the bias voltage supplied from the voltage source 52 to the source line 28 and also to the bit line 40 may be a positive bias voltage that is in a range between 1 volt and 1.5 volts, and the bias voltage supplied from the voltage source 52 to the bit line 40 may be a negative bias voltage, such as −0.3 volts. The bias voltage supplied by the word line 32 to the gate electrode 18 of the field-effect transistor 12 to provide the parallel-to-antiparallel state change is less than in conventional biasing schemes, which tend to overdrive the gate electrode 18 in order to cause the state change. The positive bias voltage supplied by the source line 28 to the source region 22 of the field-effect transistor 12 is higher than in conventional biasing schemes, and the equal positive bias voltages supplied to the source line 28 and bit line 40 contrast with the different positive voltages supplied to the bit line and source line in a conventional biasing scheme. In a conventional biasing scheme, the bit line 40 is grounded instead of being biased.

The lowered word line voltage, which is due at least in part to the small negative bias voltage applied to the bit line 40, may improve reliability during operation and the power budget for operation. The biasing is sufficient to provide a critical programming current, Icrit, between the source line 28 and bit line 40 that exceeds a programming current threshold for producing the state change in magnetization and that may be greater than or equal to the critical programming current in conventional biasing schemes that require a higher word line voltage to overdrive the transistor gate.

In an alternative embodiment, a bias voltage ($V_B$) may be applied to the body of the field-effect transistor 12 to provide a back gate. The application of the bias voltage may be utilized to further decrease or lower the required positive bias voltage at the word line.

Figure 3:
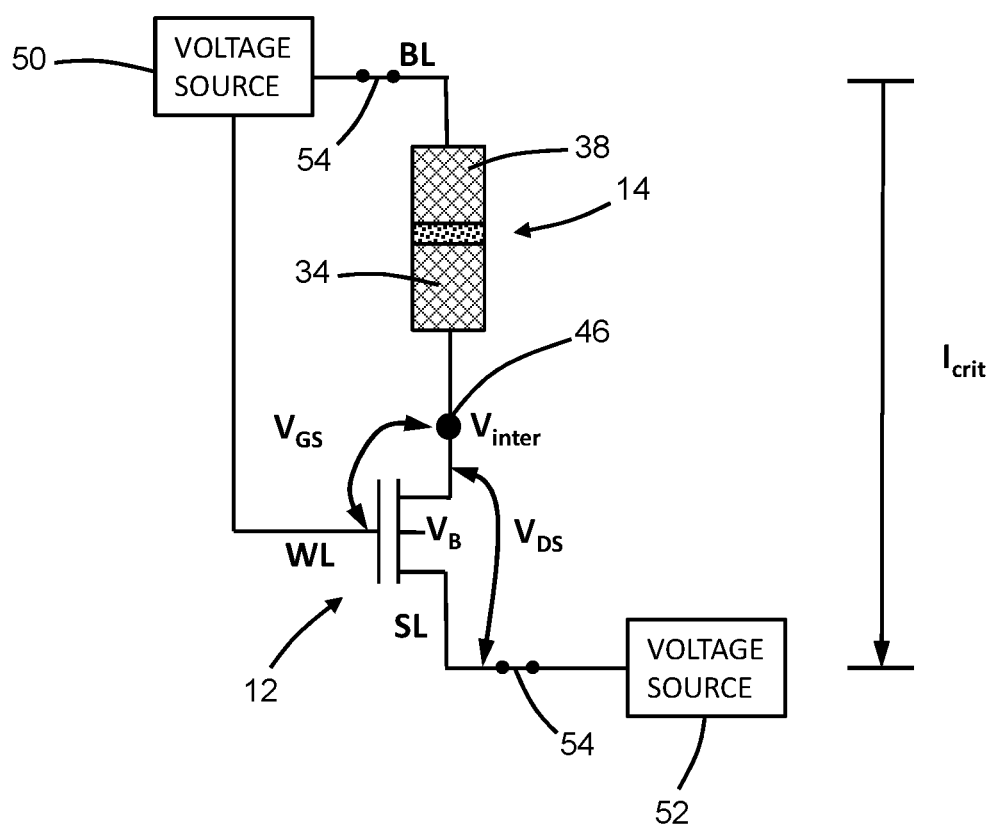
FIG. 3 is a circuit diagram of the bitcell under biasing to produce a transition from an antiparallel state to a parallel state.

With reference to FIGS. 1 and 3, a biasing scheme is described for a write operation with antiparallel-to-parallel switching that causes the magnetically free layer 38 in the bitcell 10 to change or switch from an antiparallel state relative to the fixed layer 34 to a parallel state relative to the fixed layer 34. The magnetization of the fixed layer 34 and the magnetization of the free layer 38 are in an anti-parallel state before the write operation, and the magnetization of the fixed layer 34 and the magnetization of the free layer 38 are in a parallel state following the write operation.

The word line 32 and the bit line 40 are connected with the common voltage source 50, and may be powered with equal positive bias voltages supplied from the voltage source 50. In an embodiment, the positive bias voltage may be supplied from the positive (VDD) power rail, which is a regulated voltage source, and the bit line 40 may be connected with the voltage source 50 by closing a switch 54. The source line 28 may be coupled with the voltage source 52 by closing a switch 54, and may be powered with a negative bias voltage supplied from the voltage source 52.

The positive bias voltage supplied by the bit line 40 appears at the node 46 between the field-effect transistor 12 and MTJ memory element 14 as the internal voltage ($V_{inter}$). The gate-to-source voltage ($V_{GS}$) and the drain-to-source voltage ($V_{DS}$) of the field-effect transistor 12 are effectively increased by the negative bias voltage at the node 46, which enables the reduction in the word line voltage, and at the same time may increase the current supplied to the MTJ memory element 14.

In an embodiment, the bias voltage supplied from the voltage source 52 to the word line 32 and also to the bit line 40 may be a positive bias voltage that is in a range between 1 volt and 1.5 volts, and the bias voltage supplied from the voltage source 52 to the source line 28 may be a negative voltage, such as −0.3 volts. The bias voltage supplied by the word line 32 to the gate electrode 18 of the field-effect transistor 12 during the antiparallel-to-parallel state change is lower than in conventional biasing schemes, which tend to overdrive the gate electrode 18 in order to prompt the state change. In a conventional biasing scheme, the source region 22 and the source line 28 are grounded instead of being biased, and the equal positive bias voltages supplied to the word line 32 and bit line 40 contrast with the different positive bias voltages supplied to the bit line and word line in a conventional biasing scheme. The positive bias voltage supplied to the bit line 40 is higher than in conventional biasing schemes.

The lowered word line bias voltage, which is due at least in part to the small negative bias voltage applied to the source line 28, may improve reliability during operation and the power budget for operation. The biasing is sufficient to provide a critical programming current, Icrit, between the source line 28 and bit line 40 that exceeds a programming current threshold for producing the state change in magnetization and that may be greater than or equal to the critical programming current in conventional biasing schemes that require a higher word line voltage to overdrive the transistor gate. The direction of the programming current for a write operation providing the antiparallel-to-parallel state change is opposite to the direction of the programming current for a write operation providing the parallel-to-antiparallel state change.

In an alternative embodiment, a bias voltage ($V_B$) may be applied to the body of the field-effect transistor 12. The application of the bias voltage may be utilized to further decrease or lower the required positive bias voltage at the word line.

The embodiments of the bitcell 10 and the bipolar biasing schemes applied during the different write operations permit the number of voltage sources to be reduced from five to three. Specifically, conventional biasing schemes require three regulated voltage sources for write operations, whereas the embodiments of the bitcell 10 and the biasing scheme applied during write operations require only a single regulated voltage source.

The methods as described above are used in the fabrication of integrated circuit chips. The resulting integrated circuit chips can be distributed by the fabricator in raw wafer form (e.g., as a single wafer that has multiple unpackaged chips), as a bare die, or in a packaged form. The chip may be integrated with other chips, discrete circuit elements, and/or other signal processing devices as part of either an intermediate product or an end product. The end product can be any product that includes integrated circuit chips, such as computer products having a central processor or smartphones.

References herein to terms modified by language of approximation, such as "about", "approximately", and "substantially", are not to be limited to the precise value specified. The language of approximation may correspond to the precision of an instrument used to measure the value and, unless otherwise dependent on the precision of the instrument, may indicate +/−10% of the stated value(s).

References herein to terms such as "vertical", "horizontal", etc. are made by way of example, and not by way of limitation, to establish a frame of reference. The term "horizontal" as used herein is defined as a plane parallel to a conventional plane of a semiconductor substrate, regardless of its actual three-dimensional spatial orientation. The terms "vertical" and "normal" refer to a direction perpendicular to the horizontal, as just defined. The term "lateral" refers to a direction within the horizontal plane.

A feature "connected" or "coupled" to or with another feature may be directly connected or coupled to or with the other feature or, instead, one or more intervening features may be present. A feature may be "directly connected" or "directly coupled" to or with another feature if intervening features are absent. A feature may be "indirectly connected" or "indirectly coupled" to or with another feature if at least one intervening feature is present. A feature "on" or "contacting" another feature may be directly on or in direct contact with the other feature or, instead, one or more intervening features may be present. A feature may be "directly on" or in "direct contact" with another feature if intervening features are absent. A feature may be "indirectly on" or in "indirect contact" with another feature if at least one intervening feature is present.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A memory structure comprising:
    a bitcell including a nonvolatile memory element and a field-effect transistor having a drain region coupled with the nonvolatile memory element, a source region, and a gate electrode;
    a word line coupled with the gate electrode of the field-effect transistor;
    a bit line coupled with the nonvolatile memory element;
    a source line coupled with the source region of the field-effect transistor; and
    a first power supply configured to supply a negative bias voltage to the bit line in order to provide a first state for writing data to the nonvolatile memory element or to supply the negative bias voltage to the source line in order to provide a second state for writing data to the nonvolatile memory element.

2. The memory structure of claim 1 wherein the negative bias voltage is in a range of −0.1 volts to 1 volt.

3. The memory structure of claim 1 wherein the nonvolatile memory element of the bitcell is a magnetoresistive random access memory (MRAM) element.

4. The memory structure of claim 1 wherein the nonvolatile memory element of the bitcell is a resistive random access memory (ReRAM) element.

5. The memory structure of claim 1 wherein the first power supply is configured to be internally-generated and uncontrolled.

6. The memory structure of claim 1 wherein the first power supply is a charge pump.

7. The memory structure of claim 1 wherein the first power supply is configured to supply the negative bias voltage to the bit line, and further comprising:
    a second power supply configured to concurrently supply a positive bias voltage to the word line and to the source line to provide the first state.

8. The memory structure of claim 7 wherein the positive bias voltage supplied to the word line is equal to the positive bias voltage supplied to the source line.

9. The memory structure of claim 7 wherein the second power supply is a positive (VDD) power rail.

10. The memory structure of claim 1 wherein the first power supply is configured to supply the negative bias voltage to the source line, and further comprising:
    a second power supply configured to concurrently supply a positive bias voltage to the word line and to the bit line to provide the second state.

11. The memory structure of claim 10 wherein the positive bias voltage supplied to the word line is equal to the positive bias voltage supplied to the source line.

12. The memory structure of claim 10 wherein the second power supply is a positive (VDD) power rail.

13. The memory structure of claim 1 wherein the field-effect transistor is a planar field-effect transistor, a fin-type field-effect transistor, or a gate-all-around field-effect transistor.

14. A method comprising:
   forming a bitcell including a nonvolatile memory element and a field-effect transistor having a drain region coupled with the nonvolatile memory element, a source region, and a gate electrode;
   forming a word line coupled with the gate electrode of the field-effect transistor;
   forming a bit line coupled with the nonvolatile memory element;
   forming a source line coupled with the source region of the field-effect transistor; and
   forming a first power supply configured to supply a negative bias voltage to the bit line in order to provide a first state for writing data to the nonvolatile memory element or to supply the negative bias voltage to the source line in order to provide a second state for writing data to the nonvolatile memory element.

15. The method of claim 14 wherein the first power supply is configured to supply the negative bias voltage to the bit line, and further comprising:
   concurrently supplying a positive bias voltage to the word line and to the source line to provide the first state.

16. The method of claim 14 wherein the first power supply is configured to supply the negative bias voltage to the source line, and further comprising:
   concurrently supplying a positive bias voltage to the word line and to the bit line to provide the first state.

17. A method comprising:
   providing a bitcell including a nonvolatile memory element and a field-effect transistor having a drain region coupled with the nonvolatile memory element, a source region, and a gate electrode;
   supplying a negative bias voltage to a bit line coupled with the nonvolatile memory element to provide a first state for writing data to the nonvolatile memory element; and
   supplying the negative bias voltage to a source line coupled with the source region of the field-effect transistor to provide a second state for writing data to the nonvolatile memory element.

18. The method of claim 17 wherein the field-effect transistor includes a back gate, and further comprising:
   supplying a threshold lowering voltage to the back gate of the field-effect transistor.

19. The method of claim 17 wherein the gate electrode of the field-effect transistor is coupled with a word line, and comprising:
   concurrently supplying a positive bias voltage to the word line and to the source line in addition to supplying the negative bias voltage to the bit line to provide the first state.

20. The method of claim 17 wherein the gate electrode of the field-effect transistor is coupled with a word line, and comprising:
   concurrently supplying a positive bias voltage to the word line and to the bit line in addition to supplying the negative bias voltage to the source line to provide the second state.

* * * * *